United States Patent [19]
Szu

[11] Patent Number: 4,943,556
[45] Date of Patent: Jul. 24, 1990

[54] SUPERCONDUCTING NEURAL NETWORK COMPUTER AND SENSOR ARRAY

[75] Inventor: Harold H. Szu, Bethesda, Md.

[73] Assignee: The United States of America as represented by the Secretary of the Navy, Washington, D.C.

[21] Appl. No.: 252,486

[22] Filed: Sep. 30, 1988

[51] Int. Cl.$^5$ .............................................. G06C 7/00
[52] U.S. Cl. .................................... 505/1; 350/1.1; 350/3.7; 364/600; 364/602; 364/604; 364/800; 364/807; 364/822; 365/49; 365/160; 382/15; 505/700; 505/829; 505/835
[58] Field of Search .............. 364/807, 600, 601, 602, 364/604, 513, 822, 800; 365/49, 160; 382/15; 350/1.1, 3.7; 505/835.1, 700, 829

[56] References Cited
U.S. PATENT DOCUMENTS

| 4,731,747 | 3/1988 | Denker | 364/807 |
| 4,755,963 | 7/1988 | Denker et al. | 364/807 |
| 4,807,168 | 2/1989 | Moopenn et al. | 364/807 X |

Primary Examiner—Jerry Smith
Assistant Examiner—Stephen M. Baker
Attorney, Agent, or Firm—Thomas E. McDonnell; A. David Spevack; Larry A. Root

[57] ABSTRACT

A combination of optical interconnect technology with superconducting material to form a superconducting neural network array. Superconducting material in a matrix has the superconducting current decreased in one filament of the matrix by interaction of the Cooper pairs with radiation controlled by a spatial light modulator. This decrease in current results in a switch of current, in a relative sense, to another filament in the matrix. This "switching" mechanism can be used in a digital or analog fashion in a superconducting computer application.

7 Claims, 3 Drawing Sheets

SUPERCONDUCTING NEURAL NETWORK COMPUTER AND SENSOR ARRAY

BACKGROUND OF THE INVENTION

1. Field of the Invention:

This invention relates to a concurrently and globally interconnected superconducting computer processor and sensor array. More specifically, this invention relates to an optical computer utilizing fine-grained superconductive material in a focal plane array configured to form a neural network computer architecture.

2. Description of the Prior Art:

Superconductivity has not been successfully implemented in a computer design because of the lack of an operative cryogenic memory. Attempts to implement superconductivity in a computer design creates the problem known as the "Von Neuman Bottleneck". This problem initially occurs when conventional superconducting computers use silicon based memories which can not operate effectively at the cryogenic temperatures required by the superconductor logic gate materials. The logic processes are separated from the memory storage. Switching operations can be performed at high speeds but the input and output from memory is hindered. The input/output problems slows down the speed gained from the logic processes of the conventional superconducting computer.

The later use of "Josephson junctions" as the basis for the superconductor switch, as described in U.S. Pat. Nos. 3,626,391 and 3,916,391, creates another problem in applying superconductors in computers. A Josephson junction is a diode and has no appreciable gain (only about a factor of 3). Consequently, signal-over-noise floor threshold technique cannot be used for cascading in computer operations since the noise masks the signal after a few steps.

These low gain conditions are compounded by the magnetic field crosstalk which limits the density of packaging in superconductor chip designs. Although close packaging is generally sought in electronic design, space limitations take on a significant importance for superconductors because the environs must be maintained at cryogenic temperatures.

An additional problem of superconductive systems is that there is no RC time content. Therefore, classical methods of manipulating data with clock cycles and in lock-steps requires tremendous precision in timing.

Very large scale integration (VLSI) can achieve 20,000 gates or more within a chip of about 1.5 square centimeters. However, only a few hundred connections can be made to a VLSI chip because of the two dimensional planar technology and the interference between electric signals caused by the packing ratio or component density within a chip.

Creating a global wire interconnect communication network with conventional means would require that each input/output be connected to every other input/output. Assuming N number of inputs/outputs, where N is an integer, $N^2$ interconnects would be required to couple each input/output with every other input/output. As the number of the computer processor elements increases to as many as ten thousand, $N^2$ becomes an unmanageable number of interconnects to effect by conventional means. An "$N^2$ bottleneck" exists for a global wire interconnect communications network.

One approach to solve the "$N^2$ bottleneck" is an optical processor which uses radiation as a communication medium instead of wires. A real-time transparency device is used in optical processors for high-speed parallel data throughput. A transmissive or reflective spatial light modulator (SLM) is an example of such a device. An SLM can be made from liquid crystal, a Titus tube, an electro-optical Pockels's device, optically-addressed light valves, ceramic ferroelectric devices, surface deformation light valves or any other device acting as a two-dimensional optical filter.

Optical processing has not been used with superconducting material because there is a response time scale difference between the SLM and a superconductor. The SLM has a milli- to micro-second response time while a superconductor has a considerably shorter nano- to pico-second response time. If conventional clock cycles were used, the timing difference would make manipulation of data in an optical computer utilizing superconductive material impossible because of the lack of precision in timing.

The sizes of an SLM and a neural network are also incompatible. The Defense Advanced Research Projects Agency (DARPA) has developed an experimental SLM that controls up to $1000 \times 1000$ points of light or pixels. The only commercially available SLM controls just $100 \times 100$ pixels. To date, there has been a one-to-one correspondence within the SLM and between the SLM and the data input plane of an optical computer. This correspondence limits an SLM to the same number of light valves as pixels to be controlled. A neural network which is attempting to imitate the human brain would have millions of interconnects. No commercially available or experimental SLM would have the capacity to control such a network under present process control conditions.

SUMMARY OF THE INVENTION

Accordingly, an object of this invention is to provide a neural network architecture for superconductive computers.

A related object of this invention is to operate an associative memory in a neural network system at cryogenic temperatures.

A particular object of this invention is to provide a neural network computer design that will mimic both the operation and speed of the human brain in requiring no clock and in having no CPU-memory disjointedness.

Another object of this invention is to provide a switch at the crossing of fine-grained filaments that, unlike Josephson junctions, has gain which will readily allow dense packaging on the order of a million fine processor elements in a square inch area.

Yet another object of this invention is to provide a global and iterative associative recall memory which constantly self-programs the switching patterns.

An added object of this invention is to provide a cross-filament amplifier that interacts with radiation to perform like a triode.

A further object of this invention is to provide a passive focal plane sensor array and computer for extraterrestrial applications where cryogenic cooling is easily available ambiently behind the shadow of the earth or a solar panel.

An additional object of this invention is to eliminate the "$N^2$ bottleneck" which occurs in a planar technology when attempting a global wire interconnect with conventional communications means in a computer.

An final object of this invention is to use an SLM for optical interconnects with a 1 to N correspondence where N is an integer one or greater.

These and other objects are accomplished by a parallel processing computer including an array of M×N filament crossings or nodes formed from a group of N parallel filaments positioned perpendicular to a group of M parallel filaments, where N and M are integers from 1 to 10,000. Forms a cross-filament amplifier or triode ("super-triode" if the filaments are of superconducting material). The matrix is covered by a radiation-supplying means for directing a particular intensity of radiation near an individual node for the purpose of switching signals from one of the first group of filaments to one of the second group of filaments at every node.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DESCRIPTION OF THE PREFERRED EMBODIMENT

Figure 1:
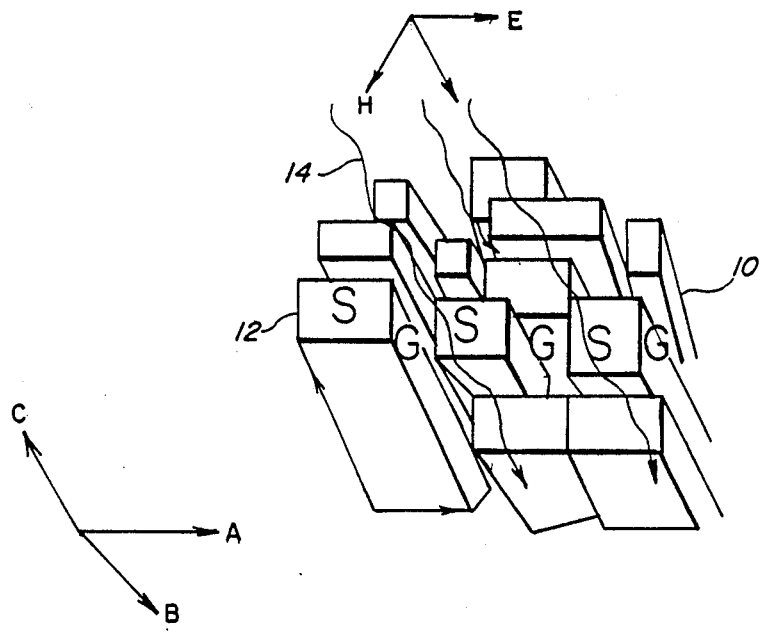
FIG. 1 is a closeup view of a portion of a filament and the interaction with radiation.

The present invention is a junction of fine-grained filaments of opto-electric radiation-sensitive material crossing one over the other to form a node. The node receives perpendicular radiation which increases resistance in the exposed filament and acts as a switch, in a relative sense, for the current. This device operates like a triode and is here termed a "supertriode" if the two crossing filaments are of superconductive material in superlattice granular crystalline form. In a preferred embodiment, the superconducting material is composed of $YBa_2Cu_3O_7$ or related superconducting materials. $YBa_2Cu_3O_7$ is preferred due to its high critical temperature of 95° K. which is 18° K. above the temperature of liquid nitrogen. Therefore, relatively inexpensive liquid nitrogen is used as the cryogenic cooling media instead of liquid helium, a colder but more expensive material.

Use of the term "filament" refers to any filament, wire-like structure, whisker, rod, cable, line, bar, cord, strand, film, string, fiber, thread or tendril of normal conductive or superconductive material. The cross-section of the filament is of any geometric form, for example, circular, oval, square, rectangular, etc. The shape of the filament is of any form of line, for example, straight, curved, irregular, asymmetric, crooked, etc. The size of the filament is macroscopic or microscopic.

Use of the term "radiation" refers to any electromagnetic waves. The radiation is in the visible or invisible spectrum, for example, visible light, infrared, ultraviolet, radio waves, etc.

Use of the term "superlattice" refers to a polycrystalline state of nonhomogeneous material in which there is periodic arrangement of a superconducting grain surrounded with a normal conducting impurity granular boundary.

Use of the term "node" refers to a place where the filaments cross and touch each other without short circuiting, i.e., where the filaments are in physical but not zero resistance electrical contact.

The following procedure can grow superconductive filaments having crystal grains at the superlattice sites of a mean lattice spacing of about a quarter wavelength of the radiation. The quarter wavelength is necessary for destructive interference of radiation reflection. Solid state reaction amounts of $Y_2O_3$, $Ba_2CO_3$ and $CuO$ are ground, pressed and sintered on an appropriate substrate at high temperatures (900°–950° C.) using a standard bake and shake technique. The substrate is one such as sapphire with both x and z axis orientation or MgO with $<110>$ or $<001>$ orientation. After the bake and shake, the material is annealed in an oxygen rich environment at approximately 800° C. by placing the material in a oven or by exposing the material to a laser beam. Current is applied during annealing with a voltage of 1000 volts AC or 100 volts DC. This current promotes formation of superconducting material by heating the material and producing the proper crystalline structure. The current can be supplied by any external electromagnetic field.

The resulting filament has all its adjacent crystal z axes perpendicular to the substrate and approximately parallel to each other and its crystal x and y axes approximately aligned, respectively. The rate of cooling after annealing determines crystal size. Slow cooling results in large crystals (approximately 1 mm) and fast cooling results in small crystals (powder). This invention does not depend on crystal size; however, uniformity and distribution of crystal size is important. At present, there is not a reliable method to control crystal size as to uniformity and distribution. The present method to guarantee proper uniformity and distribution is a physical sorting of the material.

After fabrication of the superconducting material, a superlattice is constructed. A node is formed by one filament along the macroscopic x axis physically slightly above another filament along the macroscopic y axis. The two filaments have no insulation except a grain boundary of metallic aluminum impurities separating them. The node is a super-triode having three ports: the cathode input along the macroscopic x axis, the anode output along the macroscopic y axis and the radiation grid along the macroscopic z axis.

Referring now to the drawings, wherein like reference numerals designate identical or corresponding parts throughout the several views, FIG. 1 shows the major crystal z-axes of all grains are approximately perpendicular to an appropriate substrate, such as sapphire, and parallel to each other. Also, all grains, 10, have their minor x- and y-axes approximately aligned. Each grain has an impurity boundary which forms around the major crystal z-axis which is non-superconducting.

Each superconductive filament is composed of a superlattice structure, 12, of the periodicity unit of superconductor/grain boundary with impurities/superconductor, known as SGS. The SGS superlattice enhances radiation penetration through a destructive reflection interference by means of the quarter wavelength superlattice spacing along the penetration depth in the z direction. Each filament is less than approximately 10 microns in width and carries a signal current in the range of 10–1000 microAmps from an external power source, such as a battery. The superconductive current is anisotropic in that it propagates only in the plane of the x and y axes and not along the z axis.

The exposure of the superconducting filament to radiation causes resistance to increase linearly from zero with increasing radiation intensity. The radiation is chosen to correspond with the one-quarter wavelength space in the superlattice structure. The preferable wavelength is 1–10 microns.

Current switching, due to the increased resistance, can be analog in nature whereby the intensity of the radiation can dictate how much of the current continues along the direction of one of the minor crystal axes (x direction but not z direction) and how much is switched to the direction of the other minor crystal axis (y-direction). The relationship is shown by the equation below:

$$E_A + f(E_{IR}) > E_B + E_C$$

where the function of the radiation energy $E_{IR}$ creates the "excitons" from Cooper pairs, $E_A$ is the energy along the x-axis, $E_B$ is the energy along the y-axis and $E_C$ is the energy along the z-axis.

Many Cooper pairs can no longer propagate completely free of resistance through the grain boundary of the thickness about the Cooper pair coherence length. The statistical result of the Cooper pair grain boundary interaction is that the current through the boundary becomes an analog function of the impinging radiation. Being a function of carrier density, temperature and material, the Cooper pair coherence length can become less than the persistence length of the grain boundary.

Figure 2:
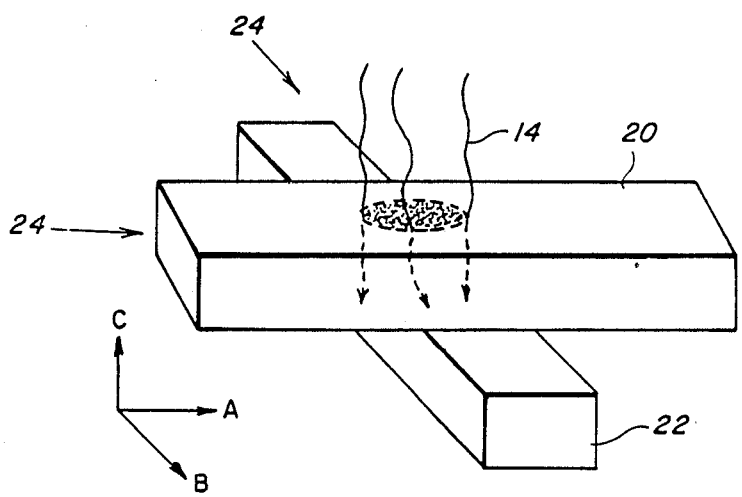
FIG. 2 is an isolated magnification of a node where two superconductive filaments are in physical but not superconductive electrical contact.

Referring now to FIG. 2, the filaments, 20 and 22, are oriented in a perpendicular manner along the x direction and y direction in a Cartesian coordinate such that they cross and overlay each other in the z direction. The crossing defines a node where radiation, 14, impinges on the top filament media, 20, cathode, but not on the bottom filament, 22, anode. The radiation interacts with the first filament only at a point just beyond the node. The second filament is underneath the first filament and is obscured from the impinging radiation. Impinging perpendicularly in the z direction, the radiation interacts with the first filament in a primary mechanism by breaking up the Cooper pairs or by letting Cooper pairs stream through the superconductive region and the resistive grain boundaries, both effects making the total exposed filament composed of the SGS periodicity less superconductive. This resistivity makes it appear that the current, 24, is "switched", in a relative sense, from the first filament to the second filament. The current intensity ratio between the two filaments changes because the second filament may be powered at a higher voltage, in a relative sense, that the first filament due to the increased resistance.

In a second mechanism the radiation penetrates the normal conducting grain boundaries, heats the impurities in the grain boundaries and alters the medium through which the Cooper pairs propagate. In this radiation heating operation, the Cooper pairs can operate like a binary or digital logic element (one for pair breaking and zero for pair forming.) The input and output are both analog but the switch is digital, being on or off.

This invention has both analog and digital properties. In the preferred embodiment, the input and output are both analog and the switching is analog. The heating mechanism can be used in analog application by gradually changing the resistivity of the grain boundaries.

A specific embodiment of the invention where the radiation is controlled by logical computing ("active application") is described as a parallel processing computer, a superconductive triode computer which uses radiation to control the triodes. The radiation contacts the array of triodes aligned the x and y directions at the perpendicular in the z direction. By using a volumetric (three dimensional) rather than a planar (two dimensional) approach this invention overcomes the $N^2$ communication bottleneck and other shortcomings of the prior art.

A matrix of nodes are variably switched in analog fashion by an optical switching means. The processor switching pattern is readjusted by the output of the processor, and subsequent signals are processed by a pattern influenced by all prior information input to the operational system.

An important aspect of the present invention is its utilization as a switch apparatus for superconductor applications. One group of M number of filaments of superconducting materials is configured perpendicularly to a second group of N number of filaments of superconducting material (where M and N are integers from 1 to 10,000). Each of the first filaments are in physical contact with the second filaments along the non-superconducting crystal axis without short circuiting, forming a node.

Assuming a 25 micron separation between the filaments of a 1,000×1,000 matrix, the size of the super-triode matrix is about 6.25 square centimeters (one square inch), which is two orders of magnitude smaller than conventional optical neural implementation. The radiation-material interaction is tenfold more sensitive than conventional optical neural network implementation.

A radiation emitting means supplies a controlled amount of radiation to a point on the first filament opposite the input side and beyond but near the node. The radiation makes the first filament resistive and causes a current travelling in the first filament to be reduced and relatively "switched" with respect to the current flowing in the second filament.

The output of the first and second groups of filaments influences in part which nodes to "switch" by input to a radiation-supplying control grid. This radiation-supplying control grid includes a radiation source and a means to direct the radiation and to control the intensity of the radiation, such as a laser and a spatial light modulator (SLM). Operatively, an information signal is input to the first group of filaments and processed by a preprogrammed radiation-supplying means, such as a computer generated hologram (CGH), and stored in a fixed pattern in a spatial light modulator. An output current from one group of filaments is fed back into the SLM to adjust the dielectric constant. The dielectric constant affects the processing pattern of the radiation-supplying means for the next signal, thereby fine-tuning by providing interactive convergence toward a solution matrix based on the initialization and the input.

The SLM is used to create optical interconnects with the grid of superconducting cross-filaments. The response time scale difference with superconductor can be used as an advantage in stability of learning for handling inputs. Just as the difference in response time between the eye and the brain in reacting to a visual image allows signal repetition and time and spatial averaging for memory, the response time difference between the SLM and superconductors will allow the repetition of the signal to minimize noise and fix the signal in computer memory. Also, because the operation of the superconducting neural network computer is asynchronous the time differential will not cause a bottleneck or any disjointedness.

At the present state of development, the size of the SLM is presently limited to 1000×1000 pixels. As mentioned above, the neural network can require millions of interconnects. By using a local gradient for a lens effect for each pixel in the SLM, a one to N correspondence, where N is an integer from one to ten, within the SLM is obtained. For example, a multilayer hierarchical cascading system in which the top layer of the SLM is a 1000×1000 pixel tier and the bottom layer of the SLM is 10 multiples of the top layer forms a coupled set permitting 10 million interconnects to be accessed.

The superconductive triode array and the SLM from a coupled set has a correspondence between a pixel on the SLM and a node in the superconductive array. The superconductive array has N×M supertriodes that change the input current vector of M components $(I_1, \ldots I_M)$ to the output current $(O_1, \ldots O_N)$ according to the controlling radiation impinging on a node. The relationship may be expressed as follows:

$$(O_1, \ldots O_N)_t = [\text{supertriodes}](I_1, \ldots I_M)_t$$

The output current at time t is flowing to the SLM in which the short term memory is stored and can be adaptively changed by the current intensity. An output current vector is produced from the SLM to be mixed with the next input to the superconductive array at time t+1 which can be expressed as follows:

$$(I_1, \ldots I_M)_{t+1} = [\text{SLM}](O_1, \ldots O_N)_t$$

Together the two above equations illustrate an adaptive feedback system of nonlinear matrix-vector multipliers. The difference in response time between the SLM and the superconductive array provide a stable merging of the fast changing inputs with the relatively slow response time of the change in radiation intensity through the SLM.

The SLM is used to store a fixed pattern and act as long term memory by means of a CGH. This pattern is adapted or changed by the SLM but the basic pattern remains fixed. Different patterns are input for different functions or purposes.

Figure 3:
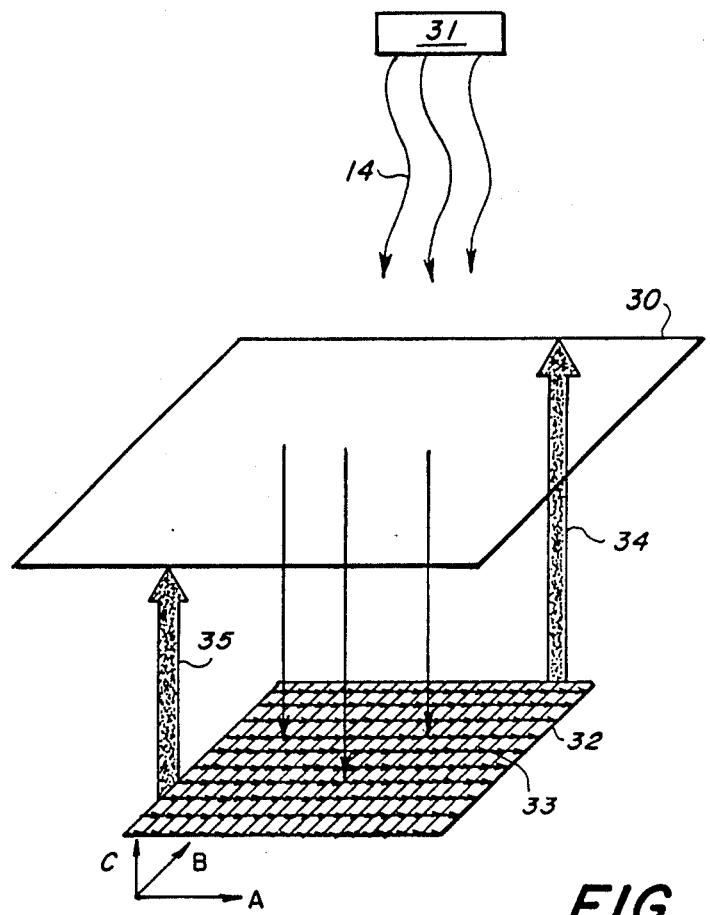
FIG. 3 is a view of a radiation-supplying means, a portion of a spatial light modulator (SLM) which directs radiation to particular nodes, and a corresponding portion of superconducting matrix which delivers outputs to the SLM.

As shown in FIG. 3, a spatial light modulator (SLM), 30 through which radiation from an infrared light source, 31 is projected onto a superconductive grid of fine elements, 32, having multiple cross filaments, 33, (detail shown in FIG. 2). The spacing between the SLM and the grid is in the range from 1 to 10 microns. The SLM is of material such as liquid crystal and operates to allow light to pass through it like a variable shutter. The determination of the intensity transmitted to the grid, 32, is made based on the current reaching the particular gate in the m and n directions.

The SLM's cells are mapped one-to-one with the cross filaments of the grid, 32, in one embodiment. In another embodiment a concave lens is placed between the SLM, 30, and the light source, 31, to insure that radiation is evenly distributed over the SLM.

Figure 4:
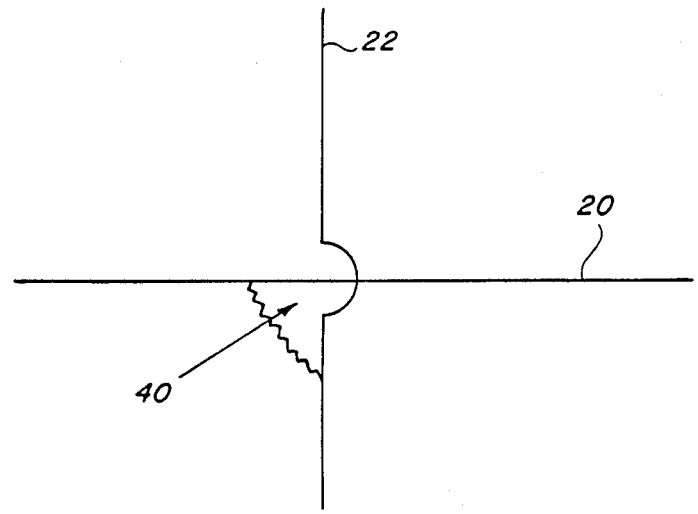
FIG. 4 is a representational view of a switch between the cross-filaments of a node.

FIG. 2 shows an isolated view of a cross filament junction between (a direction) filament, 20, and (b direction ) filament, 22. The filaments are physically touching but not superconductively contacted in the sense of short circuit. Conceptually they are represented by the equivalent circuit shown in FIG. 4 as if it were not directly connected but rather switched by light switch, 40.

Without the introduction of light, the Cooper pairs of electrons would prefer to travel along filament, 20, along the direction of one of the minor crystal axes (a-direction and b-direction). However, by striking the superconductive filament, 20, with light via the SLM the filament can be changed to a less superconducting state causing a relative change in current intensities between filament, 20, and filament, 22, which becomes relatively more energy-favorable to the Cooper pair.

As shown in FIG. 3, the output of the N filaments is fed into the SLM 30 by connections, 34, in a one embodiment, and similarly the output from the M filaments is fed into the SLM by connections, 35, in another embodiment. By connecting the output of the grid, 32, to the SLM, 30, the system iteratively converges to a matrix based on the initiation of the SLM and the continued input of the grid.

An embodiment of the invention where images of the outside world are sensed ("passive application") is an imaging system apparatus configured as a first group of N parallel filaments positioned perpendicular to a second group of M parallel filaments, collectively forming a focal planar array of a matrix of MxN nodes. Each of the filaments carries a small base current for measuring the relative change of current due to the impinging radiation on the first group of filaments. Each node is a pixel which can be individually addressed and interrogated by other outside means.

This embodiment includes a means to focus radiation from an object onto individual nodes at a place on one of the first group of filaments just past the node to be switched. Thus the array of super-triode sensors, by each individually reacting to the image radiation in this way, patterns the image into an output means for each of the nodes of the sensor.

This invention also contemplates an extraterrestrial deployment where the ambient temperature without solar heating is of 4° K., adequate to cool a number of different superconducting materials. In the earth's shadow, there will be no need for heavy cooling equipment. Applications on a space platform for communications, earth resource IR surveillance or other applications with an immense amount of data throughput with a self-organizing or self-programming ability are feasible.

Figure 5:
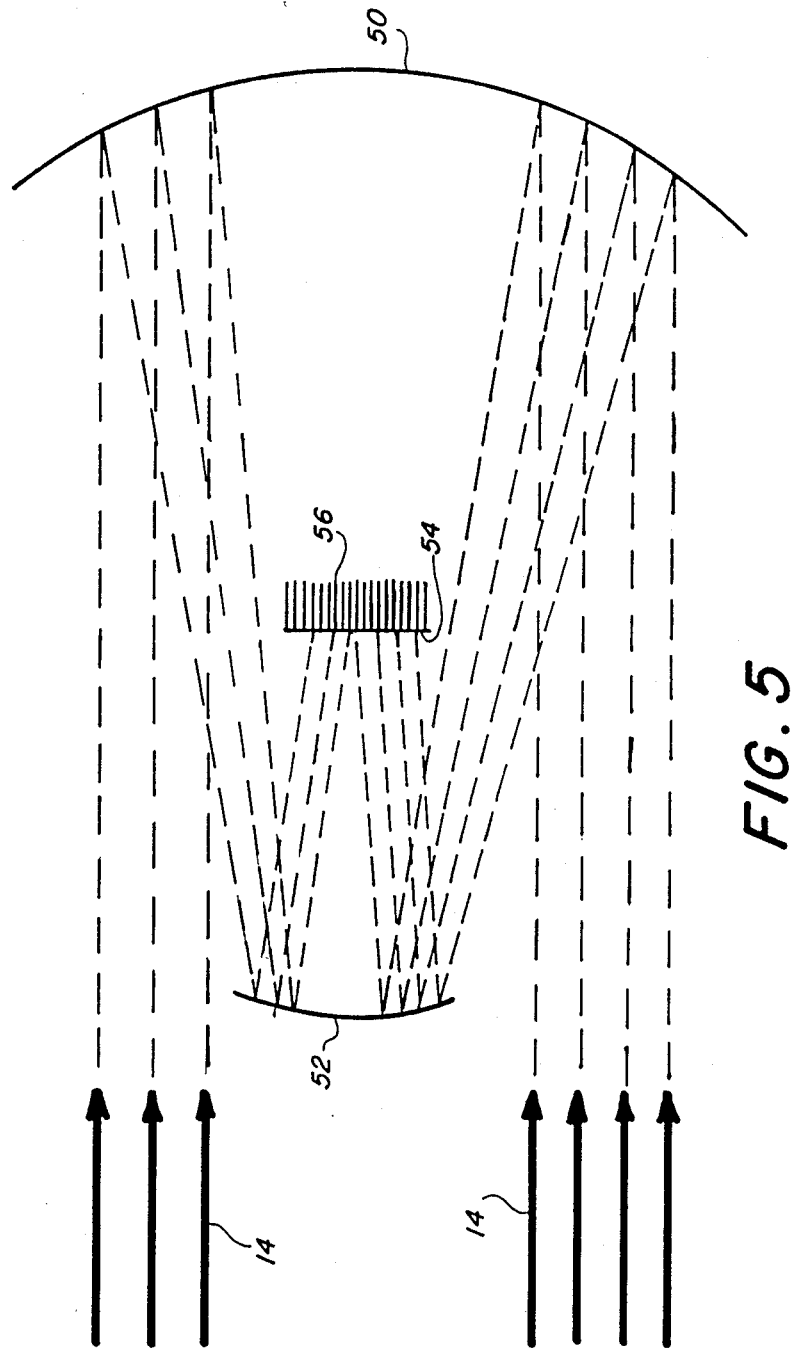
FIG. 5 is a schematic diagram of an imaging system using a super-triode matrix as a focal plane sensor array.

One embodiment is as an extraterrestrial sensor for images on the earth's surface, such as the KHX Rubber Mirror satellite. As shown in FIG. 5, the radiation, 14, from the image on earth is focused by a parabolic mirror, 50, onto an infrared lens, 53. The lens focuses the radiation onto the superconductive filaments forming a focal planar array, 54. This apparatus has wave front tilt sensing; that is, it senses the arrival angle of the radiation wave plane. Turbulence can be corrected. By connecting each pixel to an output, 56, a point-by-point reproduction is made on the superconductive filament matrix. The advantage of this arrangement is that there are $N^2$ real-time outputs as opposed to the conventional row-sum and column-sum outputs which yield only 2N outputs. The definition and clarity of the image is greatly improved by the increase in the density of output and the sensitivity of the superconductive filament matrix. This apparatus makes a coherent IR detector possible.

The system has many applications, most notably Megapixel imaging systems. In addition, verbal data retrieval based on fragment of passages like the present Lexis TM and Nexis TM systems could be many times faster.

Most importantly, this system is capable of natural intelligence in that it continues to learn by itself and converge and reconverge based on new input and information already stored in the pattern of the SLM. The synergism between a cryogenic superconductive computer and an optical computer makes possible a machine operating at a rate of $10^{15}$ operations per second. This is equivalent to a human brain of $10^{10}$ neurons and $10^4$ interconnects with 10 operations per second or to $10^6$ Cray computers operated together, a MegaCray, a sixth generation computer, the frontier of science on which heavy international competitions exists.

The material comprising this invention need not be superconductive but can be any opto-electric radiation sensitive material. The apparatus and method described above are applicable to non-superconductive devices and operations if opto-electric radiation sensitive material which is normal conductive is used.

Obviously, numerous additional modifications and variations of the present invention are possible in light of the above teachings. It is therefore to be understood that, within the scope of the appended claims, the invention may be practiced otherwise than as specifically described herein.

I claim:

1. A parallel processing computer apparatus formed by an array of triodes comprising:
   a first group of N parallel filaments of a opto-electric light sensitive material, where N is an integer from 1 to 10,000, wherein each filament carries a current flow;
   a second group of M parallel filaments of a opto-electric light sensitive material, where M is an integer from 1 to 10,000, wherein each filament carries a current flow and is positioned perpendicular to and under a filament from the first group of filaments, in physical but not electric contact with the filaments from the said first group of filaments, collectively forming an array of M×N triodes at filament crossing nodes;
   a light-supplying control means above the array for focusing particular intensities of light in a fixed pattern to points perpendicular to the filaments of the first group of parallel filaments just beyond the individual nodes such that the light impinges only on filaments of the first group of parallel filaments and not on the second group of parallel filaments;
   a means of receiving output signals from one group of filaments and feeding the signals into the light-supplying control means to adjust the pattern of the light, thereby providing iterative convergence toward a solution matrix based on the initialization and the input.

2. A parallel processing computer apparatus as recited in claim 1 wherein the opto-electric light sensitive material is superconducting material in granular crystalline form of a mean lattice spacing of about a quarter wavelength.

3. A parallel processing computer apparatus as recited in claim 2 wherein the light-supplying control means comprises a light source and a means for directing and controlling the light.

4. A parallel processing computer apparatus as recited in claim 3 wherein the light-supplying control means comprises a laser and a spatial light modulator through which radiation from the laser is directed and controlled.

5. A parallel processing computer apparatus as recited in claim 4 wherein the superconducting material is fine-grained $YBa_2Cu_3O_7$.

6. An imaging system apparatus comprising:
   a first group of N parallel filaments of a superconductive material, where N is an integer from 1 to 10,000, wherein each filament carries a base current;
   a second group of M parallel filaments of a superconductive material, where M is an integer from 1 to 10,000, wherein each filament carries a base current and is positioned perpendicular to and under one filament from the first group of filaments, collectively forming an array of M×N super-triodes at filament crossing nodes;
   a light controlling means for directing light from an image to a point on the first group of filaments just beyond the point where the second filament crosses the first filament,
   a means for receiving output signals from each node of the first group of filaments.

7. An imaging system apparatus as recited in claim 6 wherein the light controlling means is a parabolic mirror which focuses the light on an infrared lens.

* * * * *